United States Patent
Weidner

(10) Patent No.: US 11,275,878 B2
(45) Date of Patent: Mar. 15, 2022

(54) SYSTEM FOR PRODUCING A DATA STREAM ON THE BASIS OF REDUNDANT INFORMATION

(71) Applicant: WAGO Verwaltungsgesellschaft mbH, Minden (DE)

(72) Inventor: Markus Weidner, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 16/937,129

(22) Filed: Jul. 23, 2020

(65) Prior Publication Data

US 2020/0356715 A1    Nov. 12, 2020

Related U.S. Application Data

(63) Continuation of application No. PCT/IB2019/000006, filed on Jan. 14, 2019.

(30) Foreign Application Priority Data

Jan. 24, 2018    (DE) .................... 10 2018 000 559.4

(51) Int. Cl.
*G06F 30/327*    (2020.01)
*G06F 9/38*    (2018.01)

(52) U.S. Cl.
CPC .......... *G06F 30/327* (2020.01); *G06F 9/3851* (2013.01)

(58) Field of Classification Search
CPC ............................ G06F 30/327; G06F 9/3851
See application file for complete search history.

(56) References Cited

U.S. PATENT DOCUMENTS 8,341,508 B2    12/2012  Yamada et al.
2014/0204958 A1*  7/2014  Von Boehn ............. H04L 69/22
                                                        370/464

FOREIGN PATENT DOCUMENTS

DE         10065907 A1      9/2002
EP          2256565 A2     12/2010
JP         H05292105 A    11/1993

OTHER PUBLICATIONS

International Search Report dated Apr. 23, 2019 in corresponding application PCT/IB2019/000006.

* cited by examiner

*Primary Examiner* — Vuthe Siek
(74) *Attorney, Agent, or Firm* — Muncy, Geissler, Olds & Lowe, P.C.

(57) ABSTRACT

A system for producing a data stream based on redundant information that has a first controller, a second controller and a circuit. The first controller outputs a first part of first data via a first data output. The second controller outputs a second part of second data via a second data output. The circuit combines the data that is output to form a data stream. The first controller reads in at least the second part of second data of the combined data stream. The second controller reads in at least the first part of first data of the combined data stream. The read-in second part of second data is compared with a second part of the first data and if the comparison indicates a deviation, to stop outputting data via the first data output and/or to block the forwarding of the data stream.

18 Claims, 3 Drawing Sheets

SYSTEM FOR PRODUCING A DATA STREAM ON THE BASIS OF REDUNDANT INFORMATION

This nonprovisional application is a continuation of International Application No. PCT/IB2019/000006, which was filed on Jan. 14, 2019, and which claims priority to German Patent Application No. 10 2018 000 559.4, which was filed in Germany on Jan. 24, 2018, and which are both herein incorporated by reference.

BACKGROUND OF THE INVENTION

Field of the Invention

The present invention relates to a system for producing a data stream based on redundant information.

Description of the Background Art

The prior art discloses systems in which security-related information is transferred via insecure transfer paths and is checked for errors on the receiving end. In this case, communication devices can be provided on the transmitting and/or receiving end, which monitor one another, for example by cyclically exchanging and comparing calculation results.

SUMMARY OF THE INVENTION

It is therefore an object of the present invention to improve communication devices to alternately transfer security-related information via a common transfer path and monitor the transfer path during the transfer, wherein the data of both communication devices is mutually supportive, such that valid communication can take place only if both communication devices participate in the transfer, and communication can be stopped by both communication devices by them ceasing to participate in the transfer.

In an exemplary embodiment, a system for producing a data stream based on redundant information comprises a first controller having a first data output, wherein the first controller is designed to output a first part of first data over the data output, a second controller having a second data output, wherein the second controller is designed to output a second part of second data via the second data output, and a first circuit which is connected to the first data output and the second data output. The first circuit is designed to combine the data that is output via the first and/or the second data output to form a data stream. The first controller is designed to read in at least the second part of the second data of the combined data stream. The second controller is designed to read in at least the first part of the first data of the combined data stream. The first controller is designed to compare the read-in second part of the second data with a second part of the first data and, if the comparison indicates a deviation, to stop an outputting of data via the first data output and/or to block the forwarding of the data stream. The second controller is designed to compare the read-in first part of first data with a first part of the second data and, if the comparison indicates a deviation, to stop an outputting of data via the second data output and/or to block the forwarding of the data stream.

The term "controller" can be understood in particular to mean an electronic circuit which is designed to read in, process or output analog and/or digital signals at the rate of a clock signal. Furthermore, the term "data output" can be understood in particular to mean an electrical connection at which predefined voltage levels can be output, wherein a sequence of voltage levels represents the data to be output. Furthermore, the term "circuit" can be understood in particular a combination of electrical and/or electronic components to form a functionally appropriate arrangement. In addition, the term "data stream" can be understood as a continuous sequence of predefined voltage levels that represent the data.

The first data and the second data can comprise the redundant information.

In this case, the term "redundant information" can be understood to be information that can be (unambiguously) mapped to each other.

If the comparison indicates no deviations, the data stream can include the second part of the first data and the first part of the second data.

If the comparison indicates no deviations, the first data can match the second data.

The controllers can be synchronized such that the first part of first data and the second part of second data are not output simultaneously.

The second controller can be designed to synchronize with the first controller by means of reading in the data stream and to output the second part of the second data via the second data output, after the first controller has output the first part of the first data via the first data output.

The first circuit can be designed as a logic circuit.

The first circuit can be designed as a non-clocked logic circuit.

The logic circuit can comprise a logic gate.

A first data input of the first controller and a second data input of the second controller can be connected via a second circuit with a data output of the first circuit, via which the data stream is output, and connected with a data output of a third controller to establish a communication link, in particular via a bus, wherein the second circuit makes it possible to read in the parts of the data stream and to receive data via the third controller.

A method according to the invention for producing a data stream based on redundant information comprises producing first data based on first information by a first controller, producing second data based on second information by a second controller, wherein the second information partially or completely matches the first information, a juxtaposition of a first part of the first data and of a second part of the second data for producing the data stream, a reading in of at least the second part of the second data of the data stream by the first controller, a reading in of at least the first part of the first data of the data stream by the second controller, and a check of the read-in data for correctness, wherein the check comprises comparing the read-in first part of the first data with a first part of the second data and comparing the read-in second part of the second data with a second part of the first data.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
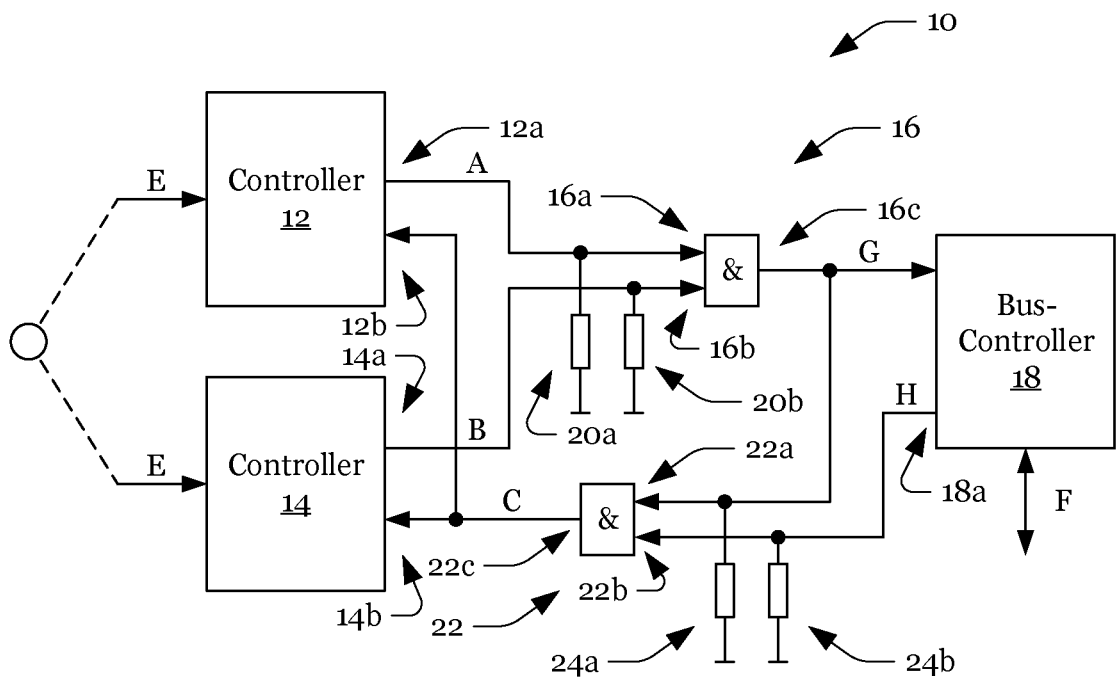
FIG. 1 shows a system according to an exemplary embodiment.

FIG. 1 shows a system 10 with a first controller 12 and a second controller 14, which are connected to a bus controller 18 via a first circuit 16. The first circuit 16 has two data inputs 16a, 16b, wherein a first data input 16a is connected via the data line A (for example, a conductor track or a wire line) to a data output 12a of the first controller 12 and a second data input 16b via the data line B (for example, a conductor track or a wire line) is connected to a data output 14a of the second controller 14. The data lines A, B are connected to ground via resistors 20a, 20b (pulldown resistors).

The first circuit 16 also has a data output 16c, at which a result of a logic operation is output. The logic operation is applied to the logic levels adjacent to the data inputs 16a, 16b so that the logic level outputted at the data output 16c is produced by the logic levels adjacent to the data inputs 16a, 16b. As shown in FIG. 1, a bus controller 18 is connected to the data output 16c of the first circuit 16 by means of the data line G. However, it is understood that instead of the bus controller 18, another communication partner can also be connected to the data output 16c of the first circuit 16.

Both controllers 12, 14 are provided with redundant information in error-free operation and are designed to transfer said information to the bus controller 18. E.g., both controllers 12, 14, as symbolized in FIG. 1 by the dashed lines, can be connected to a common information source or data source, for example one or more sensors, by means of data lines E. The controllers 12, 14 are further designed to derive/calculate first and second data from the information/data, which match in error-free operation or deviate from each other in a predetermined manner.

Figure 2:
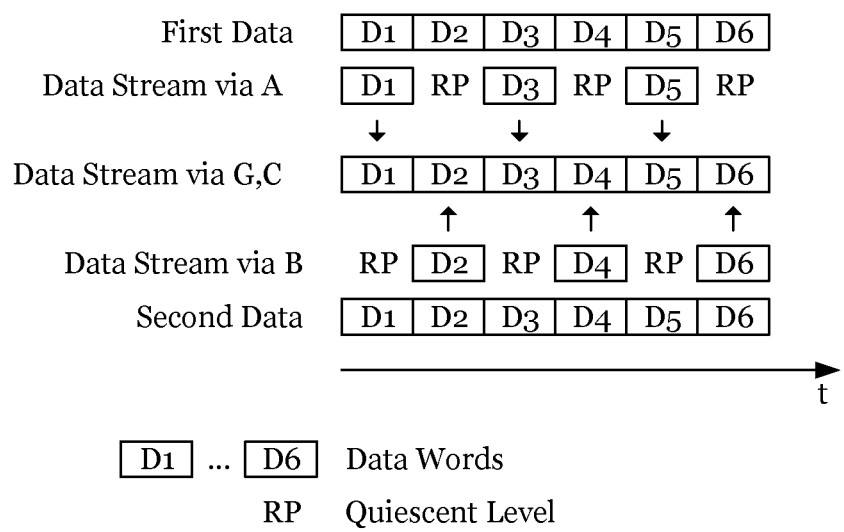
FIG. 2 shows a combined data stream.

FIG. 2 illustrates a process for assembling a data stream from parts of matching first and second data that is present in the controllers 12, 14. In this case, the data in the controllers 12, 14 is divided into correlating parts (e.g., into data words D1-D6 of a constant parameter). As illustrated in FIG. 2, one data segment (e.g., in FIG. 2, one data word) is in each case transferred by only one of the controllers 12, 14 to the first circuit 16. By means of the circuit 16, the data segments are recombined to a continuous (unbroken) data stream, which in error-free operation matches both the first data and the second data. If one controller 12, 14 transfers data, the other controller 12, 14 provides a quiescent level at the data output 12a, 14a in error-free operation. In the embodiment shown in FIG. 1, the quiescent level corresponds to a recessive logic level, i.e., a logical 1, wherein it is understood that an inverted logic with an or-link and pullup resistors can also be used.

A valid data stream can therefore only be generated when both controllers 12, 14 cooperate. It is understood that the data stream can in principle be formed by any number of segments (parts) that are alternately provided by the controllers 12, 14. Furthermore, it is understood that the controllers 12, 14 are preferably synchronized. Synchronization can take place, for example, by means of a dedicated clock line or by reading back the data stream.

To read back the data stream, the system 10 has a second circuit 22 (or a readback line), wherein a first data input 12b of the first controller 12 and a second data input 14b of the second controller 14 are connected to the data output 16c of the first circuit 16 via the second circuit 22. As shown in FIG. 1, the second circuit 22 may have a data output 22c to which the result of a logical operation is output, which is applied to the logic levels which is adjacent to the data inputs 22a, 22b of the second circuit 22. Here, a first data input 22a is connected to the data line G or the data output 16c of the first circuit 16 and a second data input 22b are connected to a data output of the bus controller 18 (data line H).

If data is transferred to the bus controller 18 via the first circuit 16, the bus controller 18 provides a quiescent level at the data output 18a, so that the logic level that is output at the data output 22c of the second circuit 22 matches the logic level applied to the data input 22a. If no data is transferred to the bus controller 18 via the first circuit 16, the second circuit 22 allows for the reception of data from the bus controller 18.

For example, the bus controller 18 can be connected to a bus via the data line F, via which the bus controller 18 can transfer data to or receive data from further bus users. Thus, bidirectional communication is possible via the circuits 16, 22. In the case of bidirectional communication, data telegrams can be exchanged, for example, wherein a data telegram generated cooperatively by the two controllers 12, 14 is sent via the first circuit 16 (and the bus controller 22) to a communication partner, who in turn responds with a response telegram that is delivered to the two controllers 12, 14 via the second circuit 22.

If data is transferred to the bus controller 18 via the first circuit 16, the controllers 12, 14 read in at least the part of the combined data stream which the respective other controller 12, 14 has produced and check the read-in data for correctness. Upstream cross communication can thus be avoided. If an error is found in the read-in data, the respective controller 12, 14 (i.e., the controller 12, 14 that has determined the error) can stop outputting data via the first data output 12a, 14a. This can enforce that the data that is output at the data output 16c of the first circuit 16 (or the data stream fragment that is output at the data output 16c of the first circuit 16) does not (no longer) match a predetermined format and that it is thus possible to detect the error on the receiving end.

For example, the bus controller 18 can check as to whether the received data stream matches a data frame or data telegram format or can validate one or more data telegrams contained in the data stream by means of redundant test values, which were calculated over an entire data frame or an entire data telegram. To be able to recognize errors as early as possible, the data words which contain the test values can be sent first.

Alternatively, or additionally, the respective controller 12, 14 (i.e., the controller 12, 14 which has detected the error) can block the output of data via the data output 16c of the first circuit 16 in that rather than the quiescent level, a dominant logic level inverted to the quiescent level is output at the data output 12a, 14a of the respective controller 12, 14, which overwrites any recessive logic levels of the other controller 12, 14, by means of which it can also be enforced that the data that are output at the data output 16c of the first circuit 16 (or the data stream fragment that is output at the data output 16c of the first circuit 16) does not (no longer) match a predetermined format (and the error can be detected on the receiving end).

A blockage of the output of data via the data output 16c of the first circuit 16 can also take place when a controller 12, 14 (for example, due to an external or internal error) switches to a safe state in that the resistors 24a, 24b are switched such that a dominant signal level, which blocks the communication of the remaining controller 12, is produced if a controller 12, 14 fails. Thus, the blocking of the transfer of data via the first circuit 16 also blocks the transfer of data via the second circuit 22, since in this state a dominant logic level is applied to the first data input 22a. If in error-free operation, however, a response is expected from a communication partner, for example, then the transfer of data via the second circuit 22 can be enabled by applying a recessive logic level to the first data input 22a.

Figure 3:
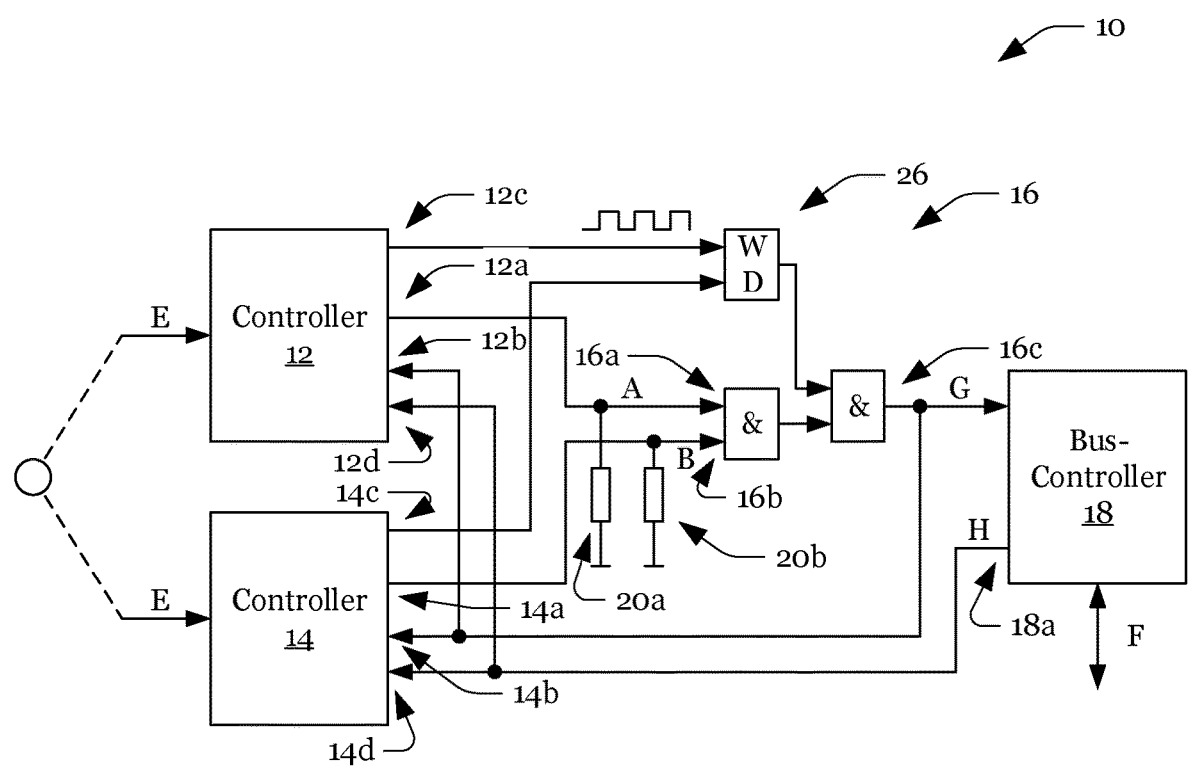
FIG. 3 shows a system according to an exemplary embodiment.

FIG. 3 shows a modified embodiment of the system 10. This is different from the system 10 shown in FIG. 1 in that two separate Y data lines are provided instead of the second circuit 22. A Y data line connects the data output 16c of the first circuit 16 with the readback inputs of the controllers 12, 14, and the second Y data line connects the data output of the bus controller 18 with data inputs 12d, 14d of the controllers 12, 14 for transferring data from the bus controller 18 to the controllers 12, 14. This makes it possible for the controllers 12, 14 to output and read in data independently of one another (and therefore simultaneously).

Furthermore, the system 10 shown in FIG. 3 differs from the system 10 shown in FIG. 1 in that the first circuit 16 has been extended by a watchdog 26. The watchdog 26 is connected to signal outputs 12c, 14c of the controllers 12, 14, which allow for the watchdog 26 to be controlled with a signal in error-free operation of the system 10, which causes the watchdog 26 to enable the transfer of the data from the controllers 12, 14 to the bus controller 18. If a controller 12, 14 fails (e.g., due to an external or internal error) or switches to a safe state and therefore does not (no longer) output the signal for controlling the watchdog 26, the watchdog 26 will block the transfer of data to the bus controller 18.

Figure 4:
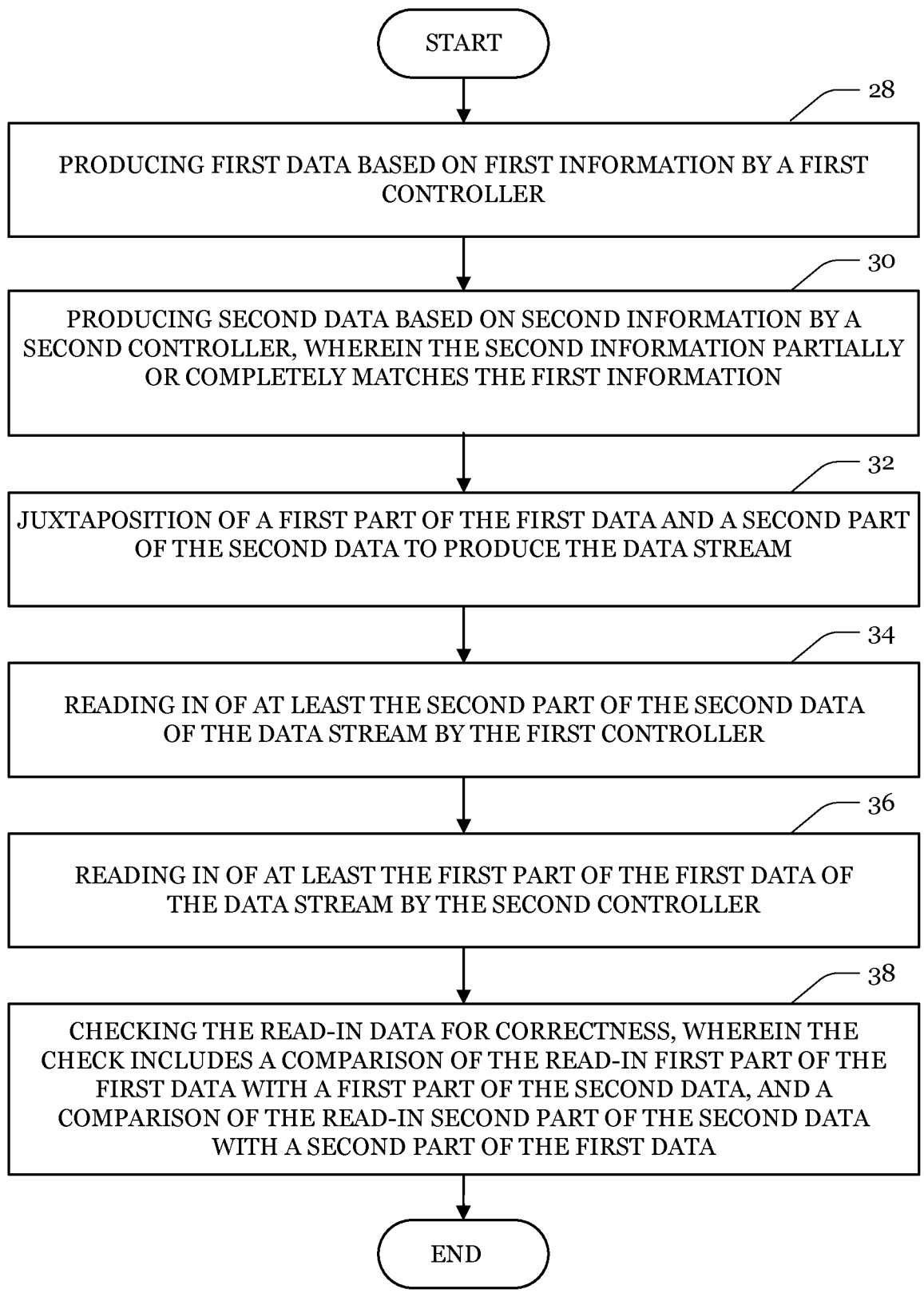
FIG. 4 shows a flowchart of a method for producing a data stream based on redundant information.

FIG. 4 shows a flowchart of a method for producing a data stream based on redundant information, which can be carried out in the systems 10 shown in FIG. 1 and FIG. 3. The method begins with the steps 28, 30 of producing first data based on first information by the first controller 12 and producing 30 second data based on second information by the second controller 14, wherein the second information partially or completely matches the first information. In step 32, a first part of the first data and a second part of the second data for producing the data stream are combined.

After the steps 34, 36 of reading in at least the second part of the second data of the data stream by the first controller 12 and reading in at least the first part of the first data of the data stream by the second controller 14, in step 38, the read-in data is checked for correctness, wherein the check includes a comparison of the read-in first part of the first data with a first part of the second data and a comparison of the read-in second part of the second data with a second part of the first data.

If differences are detected in the comparison indicating an error during the production or transfer of the data, the transfer of further data via the first circuit 16 can be blocked in that one of the controllers 12, 14 inhibits the transfer of data of the other controller 12, 14 by means of outputting a dominant logic level, or stops the transfer of its own data.

In addition, each controller 12, 14 can be designed to read back its output data and to compare it with the data to be output. This way, it can be determined as to whether the respective other controller 12, 14 correctly outputs the quiescence level, i.e., adheres to the alternating transfer, and does not disrupt the communication of the other controller 12, 14.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A system for producing a data stream based on redundant information, the system comprising:
    a first controller having a first data output, the first controller being designed to output a first part of first data via the first data output;
    a second controller having a second data output, the second controller being designed to output a second part of second data via the second data output; and
    a first circuit connected with the first data output and the second data output, the first circuit being designed to combine data that is output via the first data output and/or the second data output to form a data stream,
    wherein the first controller is designed to read in at least the second part of second data from the combined data stream,
    wherein the second controller is designed to read in at least the first part of first data from the combined data stream,
    wherein the first controller is designed to compare the read-in second part of the second data with a second part of the first data and, if the comparison indicates a deviation, to stop outputting data via the first data output and/or to block the forwarding of the data stream, and
    wherein the second controller is designed to compare the read-in first part of the first data with a first part of the second data and, if the comparison indicates a deviation, to stop outputting data via the second data output and/or to block the forwarding of the data stream.

2. The system according to claim 1, wherein the first data and the second data comprise redundant information.

3. The system according to claim 1, wherein, if the comparison at the first controller and/or the comparison at the second controller indicate there are no deviations, the data stream comprises the second part of first data and the first part of second data.

4. The system according to claim 3, wherein, if the comparison at the first controller and/or the comparison at the second controller indicate there are no deviations, the first data matches the second data.

5. The system according to claim 1, wherein the first controller and the second controller are synchronized such that the first part of the first data from the first controller and the second part of the second data from the second controller are not output simultaneously.

6. The system according to claim 1, wherein the first circuit is a logic circuit.

7. The system according to claim 6, wherein the logic circuit comprises a logic gate.

8. The system according to claim 1, wherein the first circuit is a non-clocked logic circuit.

9. The system according to claim 1, wherein a first data input of the first controller and a second data input of the second controller are connected to establish a communication link via a second circuit with a data output of the first circuit via which the data stream is output, and with a data output of a third controller or a bus, wherein the second circuit enables reading in the first and second parts of the data stream and receiving data via the third controller.

10. The system according to claim 1, wherein the first controller and the second controller cooperate via synchronized outputs such that if the first controller is outputting data, the second controller provides a quiescent level at the second data output and if the second controller is outputting data, the first controller provides the quiescent level at the first data output.

11. The system according to claim 1, wherein the second controller is synchronized with the first controller.

12. The system according to claim 1, wherein the first controller and the second controller output the combined data stream and read in the combined data stream independently of one another.

13. The system according to claim 12, wherein each of the first controller and the second controller output the combined data stream and read in the combined data stream simultaneously.

14. The system according to claim 1, wherein the output via the first data output and/or the second data output form the data stream as a data sequence, the first part of the first data forming a first portion of the data sequence and the second part of the second data forming a second portion of the data sequence.

15. The system according to claim 14, wherein the first controller and the second controller operating cooperatively to output the data sequence.

16. The system according to claim 1, wherein a first number of data words forming the first data is equal to a number of data words in the combined data stream, and wherein a second number of data words forming the second data is equal to the number of data words in the combined data stream.

17. A system for producing a data stream based on redundant information, the system comprising:
a first controller having a first data output, the first controller being designed to output a first part of first data via the first data output;
a second controller having a second data output, the second controller being designed to output a second part of second data via the second data output; and
a first circuit connected with the first data output and the second data output, the first circuit being designed to combine the data that is output via the first and/or the second data output to form a data stream,
wherein the first controller is designed to read in at least the second part of second data of the combined data stream,
wherein the second controller is designed to read in at least the first part of first data of the combined data stream,
wherein the first controller is designed to compare the read-in second part of the second data with a second part of the first data and, if the comparison indicates a deviation, to stop outputting data via the first data output and/or to block the forwarding of the data stream,
wherein the second controller is designed to compare the read-in first part of the first data with a first part of the second data and, if the comparison indicates a deviation, to stop outputting data via the second data output and/or to block the forwarding of the data stream, and
wherein the second controller is designed to synchronize with the first controller by reading in the data stream and to output the second part of the second data via the second data output after the first controller has output the first part of the first data via the first data output.

18. A method for producing a data stream based on redundant information, the method comprising:
producing first data based on first information by a first controller;
producing second data based on second information by a second controller, the second information partially or completely matching the first information;
juxta-positioning a first part of the first data and of a second part of the second data to produce the data stream;
reading in at least the second part of the second data of the data stream by the first controller;
reading in at least the first part of the first data of the data stream by the second controller; and
checking the read-in data for correctness,
wherein the check includes comparing the read-in first part of the first data with a first part of the second data and comparing the read-in second part of the second data with a second part of the first data.

* * * * *